(12) United States Patent
Groves et al.

(10) Patent No.: US 6,303,975 B1
(45) Date of Patent: Oct. 16, 2001

(54) LOW NOISE, HIGH FREQUENCY SOLID STATE DIODE

(75) Inventors: Robert A. Groves, Poughkeepsie; Dominique Nguyen-Ngoc, Putnam Valley; Dale K. Jadus, Wappingers Falls; Keith M. Walter, Newburgh, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/436,166

(22) Filed: Nov. 9, 1999

(51) Int. Cl.$^7$ ............................. H01L 27/10; H01L 29/04
(52) U.S. Cl. ............................. 257/594; 257/51; 257/910
(58) Field of Search ............................. 257/51, 594, 910

(56) References Cited

U.S. PATENT DOCUMENTS

| | | | |
|---|---|---|---|
| 3,878,553 | * 4/1975 | Sirles et al. | 257/594 |
| 4,331,887 | 5/1982 | Jadus et al. . | |
| 5,099,299 | 3/1992 | Fang . | |
| 5,107,233 | 4/1992 | Stoft | 333/168 |
| 5,153,453 | 10/1992 | Walters . | |
| 5,318,916 | 6/1994 | Enquist et al. . | |
| 5,446,294 | 8/1995 | Bayraktaroglu | 257/34 |
| 5,471,078 | 11/1995 | Bayraktaroglu . | |
| 5,508,552 | 4/1996 | Iranmanesh et al. | 257/571 |
| 5,554,924 | 9/1996 | McMahon et al. | 323/229 |
| 5,561,306 | 10/1996 | Imamura et al. | 257/197 |
| 5,572,063 | 11/1996 | Iranmanesh et al. | 257/565 |
| 5,587,327 | 12/1996 | König et al. | 257/197 |
| 5,648,278 | 7/1997 | Bayraktaroglu . | |
| 5,656,514 | 8/1997 | Ahlgren et al. | 257/197 |
| 5,821,820 | 10/1998 | Snider et al. | 331/48 |
| 5,854,102 | * 12/1998 | Gonzalez et al. | 257/910 |

* cited by examiner

Primary Examiner—Gene M. Munson
(74) Attorney, Agent, or Firm—Connolly Bove Lodge & Hutz

(57) ABSTRACT

A low noise, high frequency solid state diode is provided from a plurality of unit diode cells which are interconnected in parallel. Each of the unit diode cells forms an element of an array having rows and columns of unit diode cells. The diode cells include a base region of polysilicon, forming an anode, and an active cathode region which forms a diode junction with the anode. A plurality of overlapping subcollector regions interconnect the cathode regions, to provide a single, continuous collector for the diode arrays. The base region has a minimum perimeter to area ratio which reduces the resistance of each active diode region. A plurality of cathode contacts are connected to the subcollector through a respective reach region of highly doped semiconductor material. One or more metalization layers connect the cathode regions together, and the anodes of the base regions together. By controlling the size and shape of the base region of polysilicon, the series resistance of the resulting diode is minimized.

19 Claims, 6 Drawing Sheets

LOW NOISE, HIGH FREQUENCY SOLID STATE DIODE

CROSS REFERENCE TO RELATED APPLICATIONS

The present application relates to U.S. patent application Ser. No. 09/187,243, filed Nov. 6, 1998.

BACKGROUND OF THE INVENTION

Solid state diodes are used in a variety of circuit applications operating in the radio frequency range. Specifically, pin diodes and varactor diodes are used for switching purposes, as well as circuit tuning components in circuits which operate in the microwave frequency range. Varactor diodes are, for instance, commonly used to implement a voltage controlled tuning function, such as the setting of the frequency of a voltage controlled oscillator.

One of the component characteristics which limits the performance of varactor diodes and pin diodes is the series resistance which the diode offers to a radio frequency signal. In the case of a varactor diode, the Q established by a resonant circuit using the diode is highly dependent upon the series resistance of the varactor diode. In pin diode applications, the power loss incurred when switching RF signals is a significant function of the series resistance of the pin diode when biased into the conducting mode.

The series resistance of these devices in a silicided polysilicon base bipolar transistor technology is a function of the current flow from the edges of the diode active area toward the center of the diode. In the prior art approach for implementing a varactor diode or pin diode, narrow fingers of active base-collector areas, interspersed with cathode contacts on either side, are implemented in a base collector region of a silicided polysilicon base transistor. The long narrow fingers of active base collector area provide scalable area, and a relatively low series resistance since the width of the active region is kept as small as possible. However, the long, narrow diode fingers present a series resistance which is not at a minimum. It has been determined that the minimum series resistance is obtained when the perimeter to area ratio of the base collector region is minimized, and the long fingers increase the resistance associated with the diode active region. The series resistance down the length of the anode and cathode contacts also cause current crowding along the length, contributing to the resistance of the device. Accordingly, the present invention is directed to a high frequency diode which has been designed to have a minimum series resistance.

SUMMARY OF THE INVENTION

A low noise, high frequency solid state diode is provided which includes a matrix of diode cell units. Each of the diode cell units includes a polysilicon base region forming an active diode, having an anode and a cathode region. A subcollector is formed below the cathode region of each of the cell units, which overlap the subcollectors of adjacent cell units of the matrix, forming a continuous subcollector. A uniform array of contacts are provided on the surface of the matrix of diode cell units in contact with the subcollector region, and a second array of contacts are connected to each base region of each of the cell units. By interconnecting all of the first set of subcontacts in parallel, and all of the second set of contacts in parallel, the matrix of diode cell units are connected in parallel producing a single diode having a low series resistance.

In accordance with the present invention, each of the cell units has an active base region which has a minimum perimeter to area ratio shared common subcollector among the diode cell units for reducing the series resistance for the diode formed by the matrix of cell units.

DESCRIPTION OF THE PREFERRED EMBODIMENT

Figure 1:
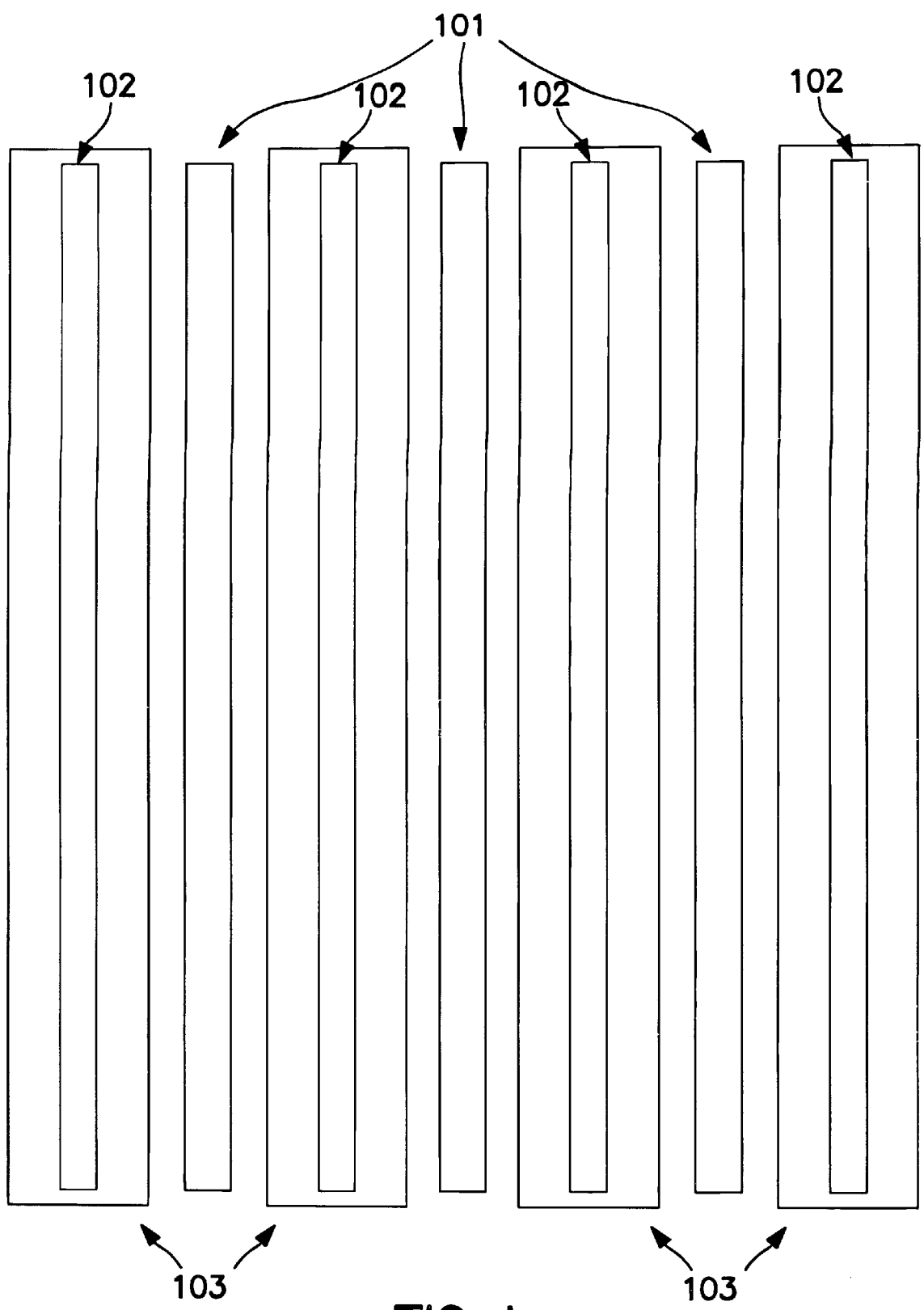
FIG. 1 is a plan view of a prior art high frequency solid state diode.

FIG. 1 represents a plan view of a diode implemented with a polysilicon bipolar transistor process. The diode includes a cathode formed of a plurality of contact stripes 101 and an anode formed from a plurality of base polysilicon stripes 102. In order to reduce the diode series resistance, the diode active region stripes 103 are made as narrow as possible, and the length of the active region stripes 103 is sufficient to provide adequate current handling requirements and to maintain a desired capacitance. The multiple diode stripes 103 reduce the total series resistance due to effective paralleling of each of the series resistances between the anode and cathode. As the diode active region under the polysilicon 103 has a length much larger than its width, the perimeter to area ratio indicates a series resistance which is not optimal. While each of the contact stripes 101 and 102 are connected in parallel, thereby lowering the series impedance of the diode, the objective of the present invention is to further lower this resistance for improving the diode performance.

Figure 2A:
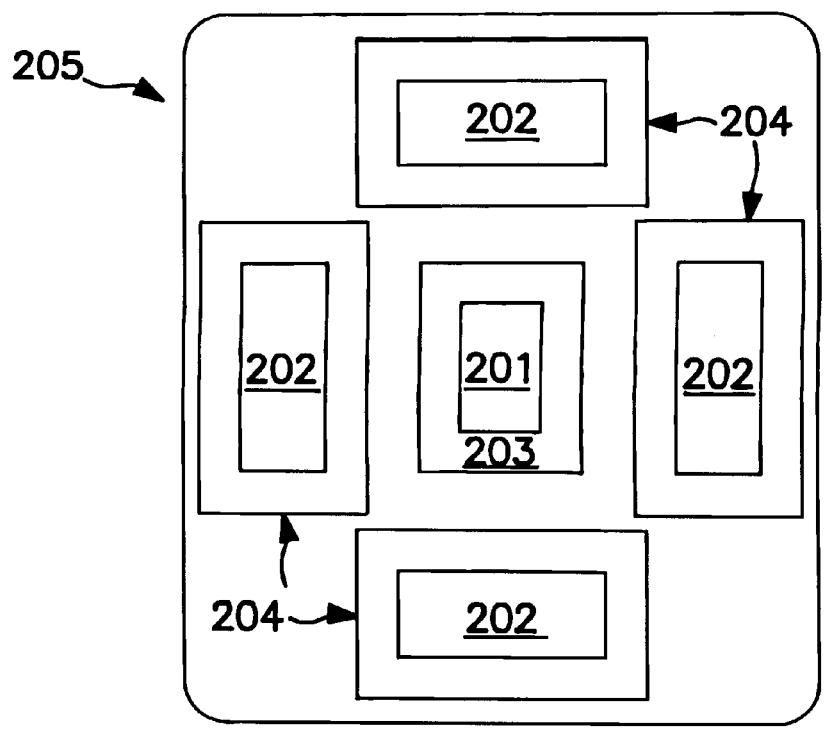
FIG. 2A is a plan view of a first implementation of a diode cell unit in accordance with one embodiment of the invention.

Referring now to FIG. 2A, a first embodiment of a diode cell unit is shown, having a lower series resistance than the diode cells comprised of the stripe 101 and 102 of FIG. 1. The plan view shows a polysilicon base region 203 defining the diode active region for the anode for the cell unit and a cathode region 204. The diode active region is substantially square, providing a small perimeter to area ratio. The polysilicon base region 203 forming the anode has a single metalized contact 201 on the surface thereof. The anode aspect ratio can be adjusted from a one-to-one aspect ratio to whatever is needed without materially changing the device. In the embodiment shown in FIG. 2A, the anode 203 width represented by the shorter dimension was determined by the minimum achievable feature size to minimize the resistance of the active diode region, while the length of the anode was based on a determined current requirement and capacitance for the unit cell. The unit cell of FIG. 2A is laid out in rows and columns to form an array or matrix of diode elements. The cathode contact 202 may overlap the corresponding cathode contacts 202 of an adjacent unit cell in a row.

Figure 2B:
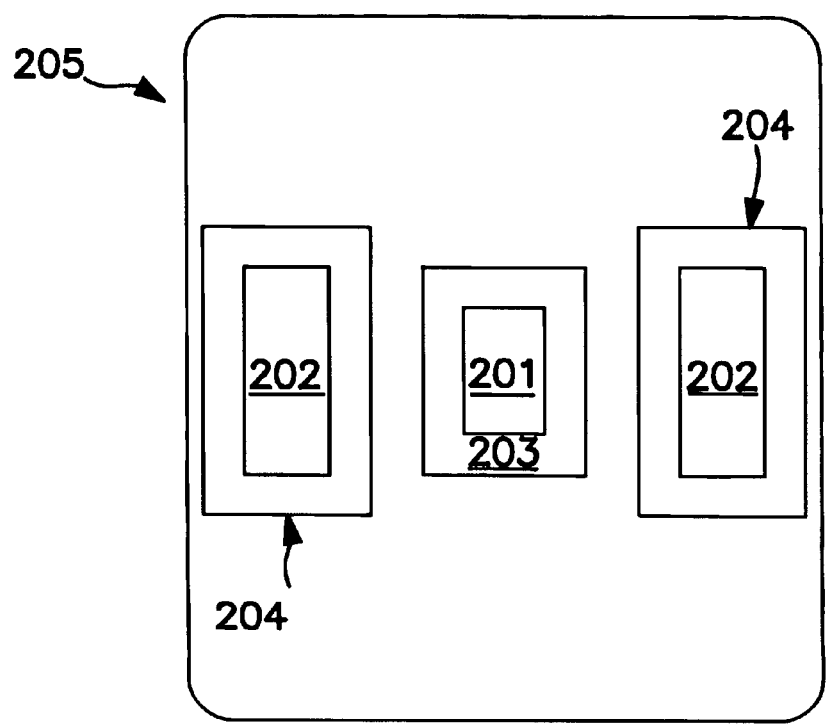
FIG. 2B is a plan view of a second implementation of a diode cell unit in accordance with the present invention.

The unit cell may include four cathode regions 204 and contacts 202 as shown in FIG. 2A, or two, as shown in FIG. 2B. As will be described with respect to a section view of FIG. 5B and 6B, each of the contacts 202 of the cathode regions 204 extend to the underside of the diode region to make contact with a subcollector region extending across the entire cell array.

The alternate embodiment of FIG. 2B provides a pair of cathode contacts 202 in each row of the cell unit. All cell units are connected in parallel through one or more metalization levels on the surface of the array. When the embodiment of FIG. 2A is implemented, it is possible to connect the anode connections 203 together as well as the cathode connections 205 using a single interconnect layer. Using the embodiment of FIG. 2A requires that at least two metalization interconnect layers to connect the respective contacts of anodes 203 and cathodes 204 of the individual unit cells in parallel.

Figure 3:
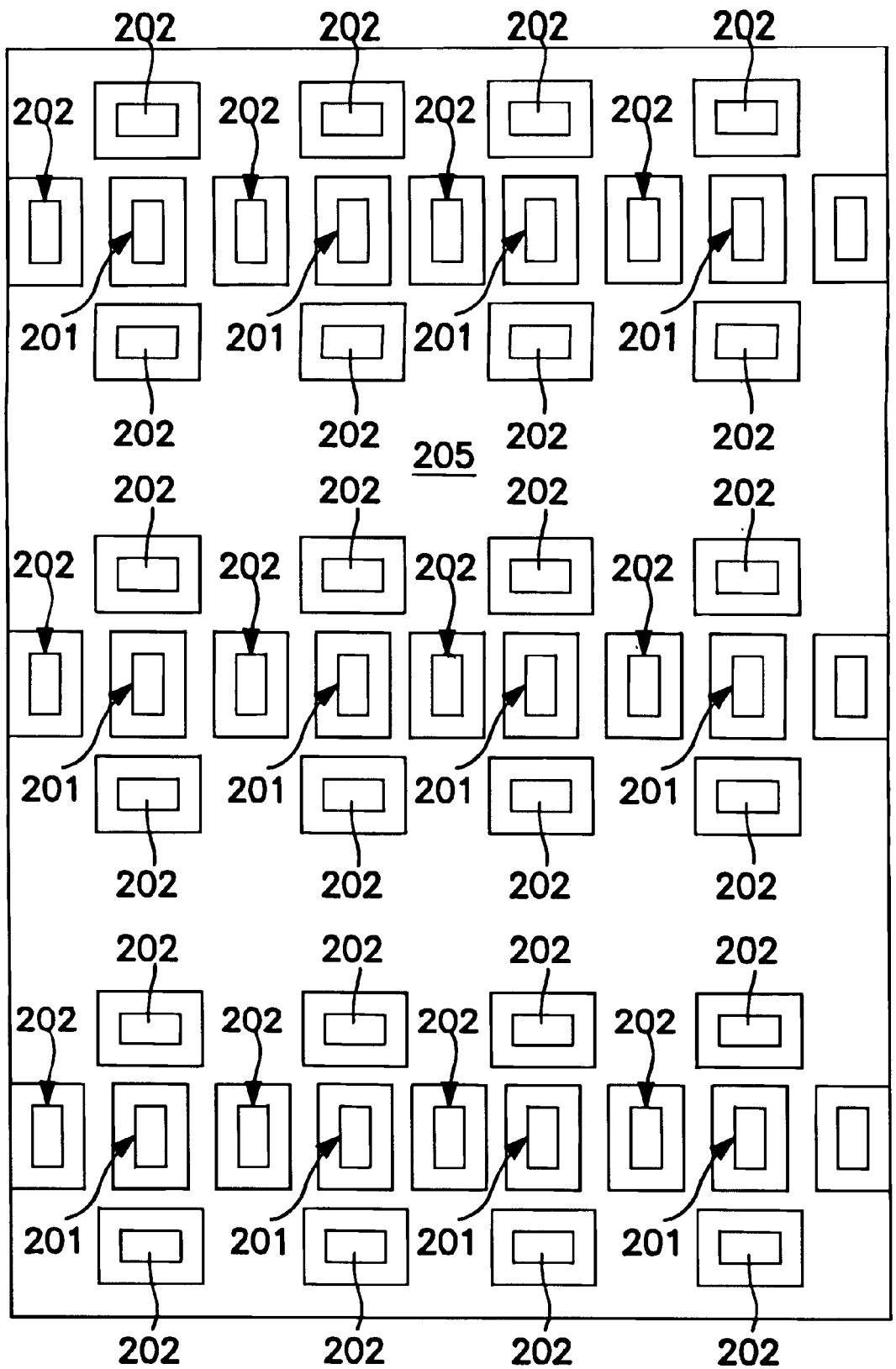
FIG. 3 is a plan view of the array of cell units shown in FIG. 2A.

FIG. 3 is a plan view illustrating a portion of the unit cell array of FIG. 2A. Each cell unit has the four cathode contacts 202, surrounding a single anode metal contact 201. In each row of the array, the cathode contacts 202 are shared between adjacent unit cells of the same row, and are interconnected with a metalization layer. The anode contacts 201 are also connected with a second level of metalization.

Figure 4:
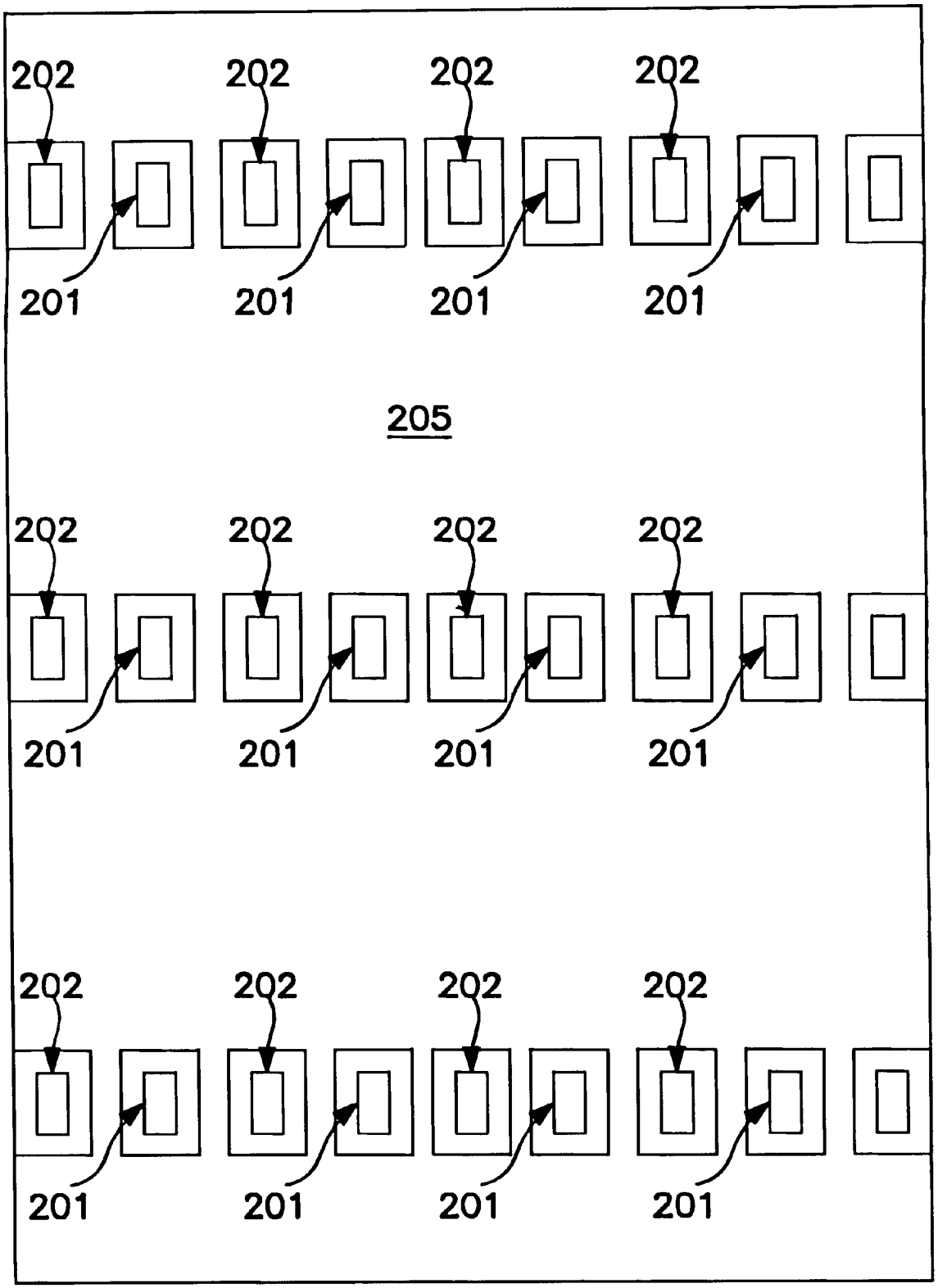
FIG. 4 is a plan view of a row of cell units for the diode array of FIG. 2B.

FIG. 4 is a plan view illustrating a portion of the unit cell array according to the embodiment of FIG. 2B. In each row of the array, the cathode contacts 201 are shared between adjacent cells in the same row, and connected together with an interconnect metalization layer. Similarly, anode contacts 202 are connected together with available interconnect metalization. The embodiment permits the use of a single metalization level to interconnect the cathode contacts 201 and anode contacts 202 to provide a single diode element, comprising parallel connections of all the unit diode cells.

Figure 5A:
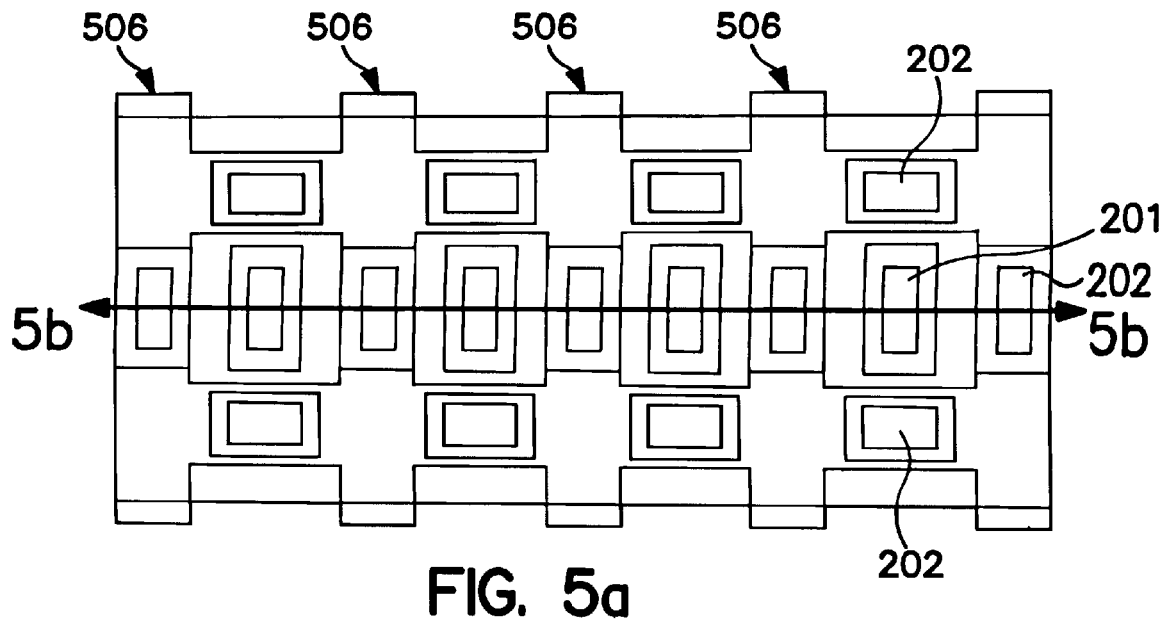
FIG. 5A is a plan view of the metalization layers interconnecting the cathode of the array of FIG. 2A.

FIG. 5A illustrates the metalization layers which interconnect the cathode elements for the embodiment of FIGS. 2A and 3. The interconnect layer 506 for connecting all the cathode connections 202 of each unit cell is shown as a grid pattern. Similarly, on a different level, a common metal region is provided to connect each of the anode connections 201.

Figure 5B:
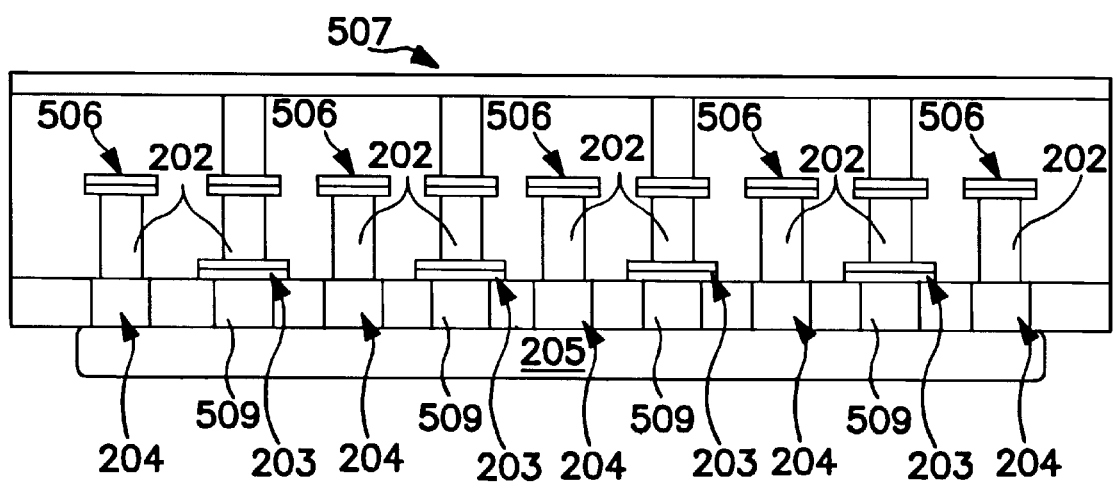
FIG. 5B is a cross-sectional view of the array of FIG. 2A.

The cross-section of a row of diode unit cells of the embodiment of FIGS. 2A, 3 and 5A is shown in FIG. 5B. A metalization layer 507 is shown connecting all of the anode connections 201 in one plane together. A lower level metalization layer 506 is shown in the section view of FIG. 5B, which connects all the cathode connections 202 in parallel. The diode cell units have a structure similar to the transistor structures of the aforesaid co-pending patent application, herein incorporated by reference. A series of cathode pedestals 509 are shown, supported on a subcollector regions 205 which are doped N+. The subcollector 205 under each cathode pedestal 509 extends into contact with a subcollector of an adjacent cell unit, forming a continuous subcollector region 205. The anode 203 is formed from a base polysilicon, p-doped region implanted over the cathode pedestal 509. A contact via 201, which may be tungsten, or a similar material used for creating vias in semiconductor manufacturing processes, connects the cathode 202 to metalization layer 506. Similarly, a different contact 201, which also may be of tungsten, or a similar material, connects the anode regions to the upper metalization layers.

The creation of a pin diode or varactor is effected by the doping of the cathode pedestal 509, to change the N doping concentration changing the characteristics of the diode from a varactor to a pin diode.

Contact with each of the cathode pedestals 509 is through the subcollector region 505, connected to a plurality of integrated circuit reach throughs 204. The reach throughs 204 are highly doped diffusion regions, which provide a conductive path from the metalization layer 506 to the subcollector 205.

The connection through a plurality of contacts and reach throughs reduces the overall series resistance for each of the diode cell units. The overlapping subcollector regions of each cell unit provides a uniform distribution of current into each of the active regions of the diode elements junction formed by anode 203 and cathode pedestal 509.

Figure 6A:
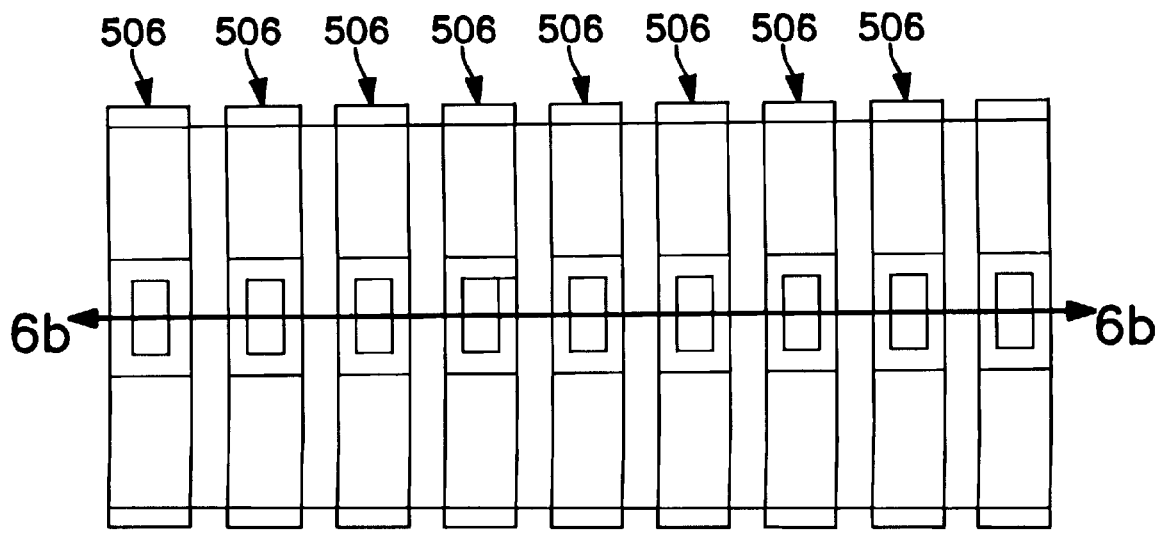
FIG. 6A is a plan view of the metalization layers interconnecting the cathode of the array of FIG. 2B.
Figure 6B:
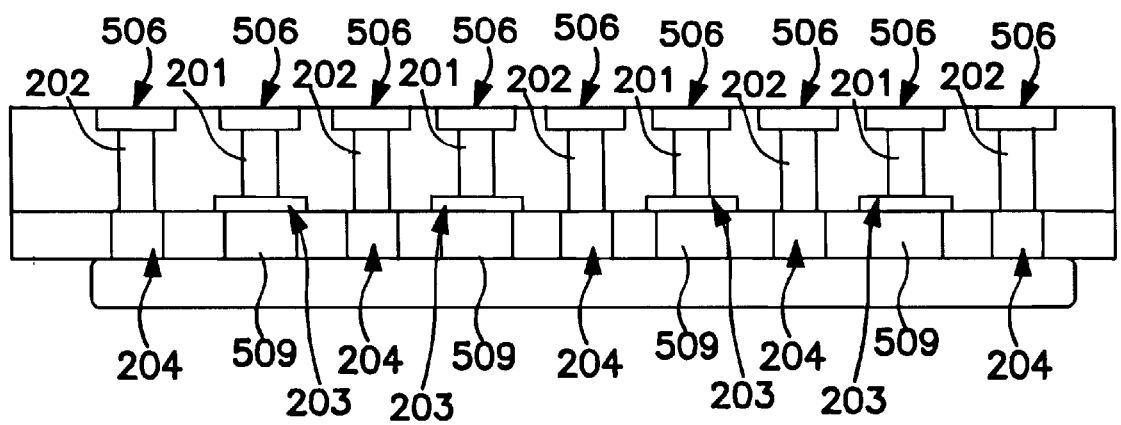
FIG. 6B is a cross-sectional view through one row of the diode array shown in FIG. 2B.

A row of cell units of FIG. 2B is shown in a plan view of FIG. 6A, and in a section view in FIG. 6B. The cell units have anode connections 201 and cathode connections 202 interconnected by the metalization of the same layer. As in the previous embodiments, overlapping subcollector regions form a continuous subcollector 205. Contact to the subcollector regions is through the reach throughs 204, which are, as is known in semiconductor processing, heavily doped diffusion areas providing electrical contact to underlayers of semiconductor material. Contact vias 202 are provided to connect the reach throughs 204 to a surface metalization layer. Each active cathode region 203 in the unit cell is connected through a via 201 to a respective metalization interconnection 506. The anode contacts 201 are all connected together using one interconnection conductor of a metalization layer 506, while the cathode contacts 202 are similarly conducted using a second interconnection conductor from the same metalization layer 506. The resulting parallel combination of individual diode cell units provides a low resistance diode for high frequency applications.

The foregoing description of the invention illustrates and describes the present invention. Additionally, the disclosure shows and describes only the preferred embodiments of the invention, but as aforementioned, it is to be understood that the invention is capable of use in various other combinations modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A low noise high frequency solid state diode comprising:
   a matrix of diode cell units, each of said cell units including a silicided polysilicon base region forming an anode region and a cathode region;
   a subcollector region connecting each cathode region of said cell units;
   a first metalization layer connected to said subcollector region; and
   a second metalization layer commonly connected to said base regions of each of said cell units, whereby said matrix of diode cell units are connected in parallel producing a series resistance less than a series of resistance of any of said individual cell units.

2. The low noise high frequency solid state diode of claim 1 further comprising:
a plurality of reach throughs connecting said first metalization layer to said subcollector region.

3. The low noise high frequency solid state diode of claim 2 wherein each of said cell units have a base region which has a minimum perimeter to area ratio.

4. The low noise high frequency solid state diode of claim 2 wherein said base region is formed in a minimum size to reduce the resistance of each active diode region.

5. The low noise high frequency solid state diode of claim 2 wherein said diode active region has a generally square shape.

6. The low noise high frequency solid state diode of claim 1 wherein said diode active region has an aspect ratio which is greater than 1:1.

7. The low noise high frequency solid state diode of claim 1 wherein said cells are arranged in a row so that contacts to said cathode overlap contacts to a cathode of an adjacent cell.

8. The low noise high frequency solid state diode of claim 1 further comprising multiple contacts for contacting different portions of said subcollector through multiple highly doped reach throughs.

9. The low noise high frequency solid state diode of claim 8 wherein said multiple contacts equal two per unit cell.

10. The low noise high frequency solid state diode of claim 8 wherein four contacts contact different portions of said subcollector for each cell unit, and are connected together by two metalization layers.

11. The low noise high frequency solid state diode of claim 1 wherein said subcollector regions of adjacent cells overlap forming a single continuous subcollector region for said matrix of diode cell units.

12. The low noise high frequency solid state diode of claim 11 wherein adjacent cell units of a row have a common cathode contact.

13. A low noise high frequency solid state diode comprising:
a plurality of unit diode cells forming an array of rows and columns, each of said diode cells including a base region of polysilicon forming an anode, and an active cathode region;
a plurality of overlapping buried subcollector regions interconnecting said cathode regions, wherein a single continuous subcollector is formed for said array of diode cells;
a plurality of anode contacts connected to each anode of said unit diode cells;
a plurality of cathode contacts connected to said subcollector;
first and second interconnections formed by a metalization which connects said cathode contacts of said array and said anode contacts, wherein each of said cell units are connected in parallel forming a single diode.

14. The low noise high frequency diode of claim 13 wherein said plurality of cathode contacts are formed by metal contacts which connect to semiconductor reach throughs extending to said subcollector region.

15. The low noise high frequency diode of claim 14 further comprising vias which connect said reach throughs to said metal contacts.

16. The low noise high frequency diode of claim 13 wherein said cathode region is formed on a pedestal which is connected at one end by said subcollector region, and which contacts said anode on an opposite end thereof.

17. The low noise high frequency diode of claim 16 wherein said subcollector region of each diode cell overlaps the subcollector region of an adjacent diode cell.

18. The low noise high frequency diode of claim 15 wherein said pedestal is doped to provide a pin diode.

19. The low noise high frequency diode of claim 15 wherein said pedestal is doped to provide a varactor diode.

* * * * *